(12) United States Patent
Singh et al.

(10) Patent No.: US 9,101,038 B2
(45) Date of Patent: Aug. 4, 2015

(54) ELECTROSTATIC CHUCK INCLUDING DECLAMPING ELECTRODE AND METHOD OF DECLAMPING

(71) Applicant: Lam Research Corporation, Fremont, CA (US)

(72) Inventors: Harmeet Singh, Alameda, CA (US); Christopher Kimball, San Jose, CA (US); Keith Gaff, Alameda, CA (US); Tyler Gloski, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 39 days.

(21) Appl. No.: 14/136,826

(22) Filed: Dec. 20, 2013

(65) Prior Publication Data
US 2015/0181683 A1 Jun. 25, 2015

(51) Int. Cl.
*H01L 21/683* (2006.01)
*H01T 23/00* (2006.01)
*H05F 3/02* (2006.01)

(52) U.S. Cl.
CPC .............. *H05F 3/02* (2013.01); *H01L 21/6833* (2013.01)

(58) Field of Classification Search
USPC .......................................................... 361/234
See application file for complete search history.

(56) References Cited

U.S. PATENT DOCUMENTS

| | | | |
|---|---|---|---|
| 5,463,526 A | 10/1995 | Mundt | |
| 5,793,192 A | 8/1998 | Kubly et al. | |
| 5,880,920 A | 3/1999 | Fischer et al. | |
| 5,880,924 A | 3/1999 | Kumar et al. | |
| 5,923,521 A | 7/1999 | Burkhart | |
| 5,933,314 A | 8/1999 | Lambson et al. | |
| 6,178,919 B1 | 1/2001 | Li et al. | |
| 6,184,489 B1 * | 2/2001 | Ito et al. | 219/121.43 |
| 6,236,555 B1 * | 5/2001 | Leeser | 361/234 |
| 6,238,160 B1 | 5/2001 | Hwang et al. | |
| 6,273,958 B2 | 8/2001 | Shamouilian et al. | |
| 6,303,879 B1 | 10/2001 | Burkhart | |
| 6,310,755 B1 | 10/2001 | Kholodenko et al. | |
| 6,483,690 B1 | 11/2002 | Nakajima et al. | |
| 6,512,333 B2 | 1/2003 | Chen | |
| 6,567,258 B2 | 5/2003 | Sexton et al. | |
| 6,639,783 B1 | 10/2003 | Shamouilian et al. | |

(Continued)

*Primary Examiner* — Dharti Patel
(74) *Attorney, Agent, or Firm* — Buchanan, Ingersoll & Rooney PC

(57) ABSTRACT

A semiconductor wafer processing apparatus for processing semiconductor wafers comprises a semiconductor wafer processing chamber in which a semiconductor wafer is processed, a process gas source in fluid communication with the processing chamber adapted to supply process gas into the processing chamber, a vacuum source adapted to exhaust process gas and byproducts of the processing from the processing chamber, and an electrostatic chuck assembly. The electrostatic chuck assembly comprises a support surface in a layer of ceramic material on which the semiconductor wafer is supported during processing of the wafer in the chamber, at least one electrostatic clamping electrode embedded in the layer of ceramic material, the at least one electrostatic clamping electrode operable to apply an electrostatic clamping force to the wafer on the support surface when an electrostatic clamping voltage is applied to the clamping electrode, and at least one declamping electrode embedded in the layer of ceramic material above the at least one electrostatic clamping electrode operable to provide a path for draining any residual charge between the wafer and the support surface when the electrostatic clamping voltage is no longer applied to the clamping electrode.

20 Claims, 8 Drawing Sheets

(56) References Cited

U.S. PATENT DOCUMENTS

| | | |
|---|---|---|
| 6,645,304 B2 | 11/2003 | Yamaguchi |
| 6,649,021 B2 | 11/2003 | Ohmoto et al. |
| 6,665,168 B2 | 12/2003 | Lin |
| 6,670,038 B2 | 12/2003 | Sun et al. |
| 6,678,143 B2 | 1/2004 | Masuda et al. |
| 6,760,213 B2 | 7/2004 | Yamamoto |
| 6,848,690 B1 | 2/2005 | Hunter |
| 6,951,587 B1 | 10/2005 | Narushima |
| 7,072,166 B2 | 7/2006 | Qin et al. |
| 7,149,070 B2 | 12/2006 | Breitschwerdt et al. |
| 7,196,896 B2 | 3/2007 | Howald et al. |
| 7,209,339 B2 | 4/2007 | Kitabayashi et al. |
| 7,218,503 B2 | 5/2007 | Howald |
| 7,274,004 B2 | 9/2007 | Benjamin et al. |
| 7,791,857 B2 | 9/2010 | Mizuno et al. |
| 7,821,767 B2 | 10/2010 | Fujii |
| 7,848,077 B2 | 12/2010 | Mizuno et al. |
| 7,869,184 B2 | 1/2011 | Steger |
| 7,892,445 B1 | 2/2011 | Wei et al. |
| 8,060,330 B2 | 11/2011 | O'Neill et al. |
| 8,098,475 B2 | 1/2012 | Sijben |
| 8,111,499 B2 * | 2/2012 | Ni et al. .................. 361/234 |
| 8,139,340 B2 | 3/2012 | Reynolds |
| 8,199,454 B2 | 6/2012 | Koyama et al. |
| 8,270,142 B2 | 9/2012 | Lee et al. |
| 8,390,980 B2 | 3/2013 | Sansoni et al. |
| 8,422,193 B2 | 4/2013 | Tao et al. |
| 8,520,360 B2 | 8/2013 | Singh |
| 8,536,494 B2 | 9/2013 | Benjamin et al. |
| 8,546,732 B2 | 10/2013 | Singh |
| 8,559,159 B2 | 10/2013 | Roy et al. |
| 2007/0109714 A1 | 5/2007 | Chung |
| 2007/0297118 A1 * | 12/2007 | Fujii ........................... 361/234 |
| 2013/0021717 A1 * | 1/2013 | Singh ......................... 361/234 |
| 2013/0088808 A1 | 4/2013 | Parkhe et al. |
| 2013/0088809 A1 | 4/2013 | Parkhe et al. |
| 2013/0100572 A1 | 4/2013 | Shu |
| 2013/0128409 A1 | 5/2013 | Nam et al. |
| 2013/0153147 A1 * | 6/2013 | Senzaki et al. ........... 156/345.26 |
| 2013/0279066 A1 | 10/2013 | Lubomirsky et al. |
| 2013/0284709 A1 | 10/2013 | Makhratchev et al. |
| 2013/0286531 A1 | 10/2013 | Shiraiwa et al. |
| 2013/0321974 A1 | 12/2013 | Kuribayashi |
| 2013/0340942 A1 | 12/2013 | Schaefer et al. |
| 2014/0063681 A1 | 3/2014 | Anada et al. |
| 2014/0071582 A1 | 3/2014 | Anada et al. |
| 2014/0116622 A1 | 5/2014 | Lee |
| 2014/0204501 A1 | 7/2014 | Moriya et al. |

* cited by examiner

ELECTROSTATIC CHUCK INCLUDING DECLAMPING ELECTRODE AND METHOD OF DECLAMPING

FIELD OF THE INVENTION

The invention relates to improvements in electrostatic chuck designs and methods of declamping wafers.

BACKGROUND

Various chucking arrangements have been developed for clamping wafers during processing thereof in vacuum chambers such as plasma etch chambers, plasma enhanced physical vapor deposition chambers, chemical vapor deposition chambers, plasma enhanced chemical vapor deposition chambers, and atomic layer deposition chambers. One challenge has been the residual sticking force between the wafer and the chuck during declamping operations. Thus, there is a need for improved chuck designs and methods of declamping which address the sticking problem.

SUMMARY

Disclosed herein is a semiconductor wafer processing apparatus for processing semiconductor wafers. The processing apparatus comprises a processing chamber in which a semiconductor wafer is processed, a process gas source in fluid communication with the processing chamber adapted to supply process gas into the processing chamber, a vacuum source adapted to exhaust process gas and byproducts of the processing from the processing chamber, and an electrostatic chuck assembly comprising a support surface in a layer of ceramic material on which the semiconductor wafer is supported during processing of the wafer in the chamber; at least one electrostatic clamping electrode embedded in the layer of ceramic material, the at least one electrostatic clamping electrode operable to apply an electrostatic clamping force to the wafer on the support surface when an electrostatic clamping voltage is applied to the clamping electrode; and at least one declamping electrode embedded in the layer of ceramic material above the at least one electrostatic clamping electrode operable to provide a path for draining any residual charge between the wafer and the support surface when the electrostatic clamping voltage is no longer applied to the clamping electrode.

Also disclosed herein is an electrostatic chuck assembly useful in a semiconductor wafer processing chamber of a semiconductor wafer processing apparatus. The electrostatic chuck assembly comprises a support surface in a layer of ceramic material on which a semiconductor wafer is supported during processing of the wafer in the chamber, at least one electrostatic clamping electrode embedded in the layer of ceramic material, the at least one electrostatic clamping electrode operable to apply an electrostatic clamping force to a wafer on the support surface when an electrostatic clamping voltage is applied to the clamping electrode, and at least one declamping electrode embedded in the layer of ceramic material above the at least one electrostatic clamping electrode operable to provide a path for draining any residual charge between the wafer and the support surface when the electrostatic clamping voltage is no longer applied to the clamping electrode.

Further disclosed herein is a method of declamping a semiconductor wafer from a support surface of an electrostatic chuck assembly after processing the semiconductor wafer. The method comprises supplying the process gas from the process gas source into the processing chamber, processing a semiconductor wafer in the processing chamber while applying a voltage to the at least one electrostatic clamping electrode so as to clamp the semiconductor wafer to the support surface of the electrostatic chuck assembly while electrically floating the at least one declamping electrode during the processing, and shutting off the voltage to the electrostatic clamping electrode and electrically connecting the declamping electrode to a conductive path after processing the semiconductor wafer to provide a path for draining any residual charge between the wafer and the support surface with the at least one declamping electrode thereby declamping the wafer from the support surface of the electrostatic chuck assembly.

BRIEF DESCRIPTION OF THE DRAWING FIGURES

DETAILED DESCRIPTION

Figure 1:
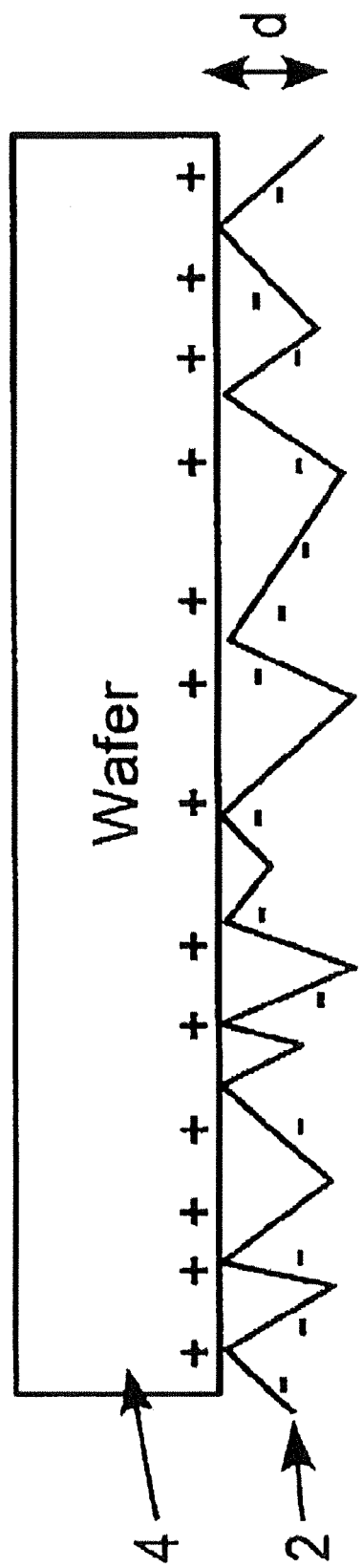
FIG. 1 is a schematic showing a rough ceramic surface of an electrostatic chuck (ESC) and a wafer backside in contact with the ESC surface.

Disclosed herein are embodiments of an electrostatic chuck with improved declamping capability for use in a semiconductor wafer processing apparatuses. The semiconductor wafer processing apparatus preferably includes a processing chamber (i.e. vacuum chamber) in which a semiconductor wafer is processed, a process gas source in fluid communication with the processing chamber adapted to supply process gas into the processing chamber, and a vacuum source adapted to exhaust process gas and byproducts of the processing from the processing chamber. The processing apparatus is preferably a plasma processing apparatus which further includes a RF energy source adapted to energize the process gas supplied into the processing chamber into a plasma state in the processing chamber. The semiconductor wafer processing apparatus also preferably includes a control system configured to control processes performed by the processing apparatus and a non-transitory computer machine-readable medium comprising program instructions for control of the processing apparatus. The processing chamber may be a plasma etching, a chemical vapor deposition chamber, a plasma enhanced chemical vapor deposition chamber, and atomic layer deposition chamber, a plasma enhanced atomic layer deposition apparatus, or the like (all of which are herein referred to as a vacuum chambers) of the semiconductor wafer processing apparatus. In the following description, numerous specific details are set forth in order to provide a thorough understanding of the present embodiments. It will be apparent, however, to one skilled in the art that the present embodiments may be practiced without some or all of these specific details. In other instances, well known process operations have not been described in detail in order not to unnecessarily obscure present embodiments disclosed herein. Additionally, as used herein, the term "about" when used with reference to numerical values refers to ±10%.

Electrostatic chuck assemblies (as used herein "ESCs") are commonly used to clamp a wafer (e.g. Johnsen Rahbek effect or Coulombic effect) and provide thermal control of the wafer (i.e. semiconductor substrate) during semiconductor fabrication processes. ESCs provide a clamping force to hold the wafer thereon when voltage (DC or AC) is applied to one or more clamping electrodes in the ESC wherein the electrostatic clamping electrode can be a monopolar or bipolar electrostatic clamping electrode. Upon the removal of the applied voltage, clamp force is expected to go to zero wherein the wafer can be easily removed. The wafer and the one or more clamp electrodes act as the electrodes of a capacitor in the presence of externally applied electric field (through a power supply). The electrostatic chuck assembly preferably includes lift pins which are operable to lower a wafer onto the support surface of the ESC before the wafer is processed, and raise the wafer from the support surface of the ESC after the wafer has been processed. An exemplary embodiment of an electrostatic chuck assembly including lift pins which are operable to lower and raise a wafer can be found in commonly-assigned U.S. Pat. No. 6,567,258 which is incorporated by reference herein in its entirety.

While under ideal conditions, the clamp force between the wafer and the clamping electrode of the ESC vanishes completely when the externally applied voltage is turned off, this is not often true under actual conditions. For example, buildup of thin films on the support surface of the ESC can lead to charge trapping on the surface of the ESC assembly. Such a charge may take longer to dissipate relative to the externally applied field, and can result in a residual sticking force on the wafer even after the applied field is switched off. For example, buildup of thin films on the ESC support surface in plasma etching chambers can be caused by fluorination of the ESC (ceramic) surface by chamber clean processes. Additionally, by-products from plasma processing can deposit on the ESC support surface leading to films capable of trapping charge.

Smoothening of the ESC assembly support surface due to repeated processing of wafers can also lead to residual sticking force. Due to differences between the coefficient of thermal expansion between a wafer, (i.e. a silicon substrate) and the ESC with a ceramic support surface, the wafer surface grinds against the ESC ceramic when plasma heat load induces the heating of the wafer (and the consequently wafer expansion). Since the wafer is being held by the clamp force during processing, this grinding between the wafer and the ESC support surface results in significant smoothening of the ESC ceramic upon extended use. The smoothened ceramic support surface results in a significant increase in actual contact area between the wafer and the ESC. Further reduction of effective distance between the ESC support surface and the wafer backside increases the clamp force due to any charge present at the interface since the force varies at $1/d^2$, where d is the distance between the wafer backside and the ceramic surface. Typically, the distance d is approximately equal to the roughness of the ESC surface (as shown in FIG. 1), so a smoother ESC surface results in a higher sticking force if any residual charge exists on the wafer surface. As mentioned previously, the residual charge may be present due to small amount of leakage current through the ESC ceramic or charge trapping by films on the ESC surface.

The residual sticking force on the wafer can lead to significant problems when the wafer is lifted up from the ESC surface including wafer popping, particle generation, and even wafer breakage.

While the wafer is clamped, small spaces/gaps between the wafer and the ESC support surface are preferably filled with helium (usually at pressures between 1-100 Torr) to provide an improved heat transfer coefficient relative to just physical contact between the wafer and the ESC.

FIG. 1 illustrates the residual forces between the rough ceramic support surface 2 of an ESC and a wafer 4 after removal of the clamping voltage. The residual sticking force can lead to problems when the wafer is lifted up from the ESC surface such as wafer popping, particle generation and even wafer breakage.

Figure 2:
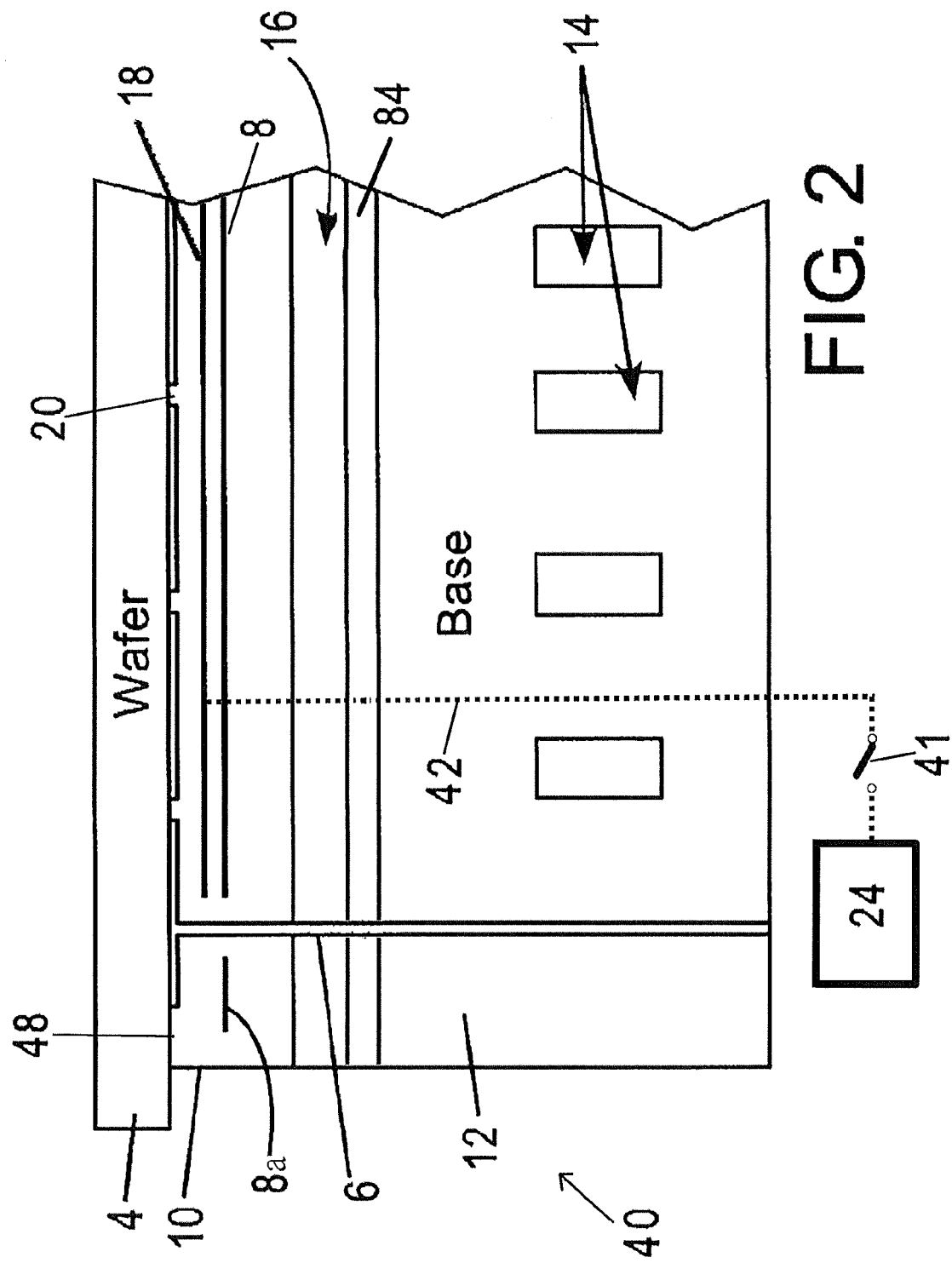
FIG. 2 is a schematic of an ESC assembly according to embodiments disclosed herein.

FIG. 2 shows an ESC assembly 40 (ESC) which is coupled to a control system 24 which is operable to control processes performed by the ESC such as raising and lowering lift pins (not shown) included therein. Holes 6 near the ESC edge deliver heat transfer gas (e.g. helium) to the backside of the wafer 4. The ESC assembly 40 has a support surface in a layer of ceramic material on which the semiconductor wafer 4 is supported. The support surface has a 1-10 mm outer annular edge seal 48 at an outer periphery thereof such that a clamped wafer is able to sustain up to about a 100 Torr pressure difference between the wafer backside and the pressure in the vacuum chamber of the semiconductor wafer processing apparatus such that the pressure of the heat transfer gas supplied to the backside of the wafer 4 can be maintained, thus enhancing thermal conductivity between the ESC 40 and wafer. Additionally, the ESC support surface includes a mesa pattern including a plurality of mesas 20 distributed on its upper surface such that contact area between the wafer 4 and the ESC surface is reduced. In such a configuration, about 3 to 10% of the area of the support surface is mesas 20 and the outer annular edge seal 48.

The mesas 20 can each have a height of about 5 to 40 microns. The mesas 20 can be of virtually any size, shape, and arrangement. For example, the mesas 20 can be elliptical, polygonal, and/or torroidal wherein the mesas 20 have vertical or sloped walls. The top surface of each of the mesas 20 can be concave, flat, or convex, and the corners can be sharp or rounded. The mesas 20 can take on a "bump" shape wherein a partial spherical shape is emerging from a flat surface. A preferred mesa shape and size is circular with vertical walls, wherein each mesa has a diameter of about 1 mm. Preferably the mesas 20 have a spacing of about 5 mm therebetween wherein the mesas substantially cover the ESC support surface.

The ESC ceramic 10 is preferably bonded onto a cooling plate (baseplate) 12 wherein the cooling plate has coolant channels 14 such that temperature of the cooling plate can be controlled by connecting the cooling plate to a temperature control unit (chiller) which circulates fluid. The thermal resistance of the bond layer 16 between the ceramic and the cooling plate can be selected such that temperature difference between the ceramic and the cooling plate can be between 2° C. and 90° C. at 10 W/cm² heat flux into the wafer 4. In addition, heaters (not shown) embedded in a heater layer 84 can form independently controllable heater zones to independently control and tune the spatial and temporal temperature of the support surface of ESC 40 as well as the spatial and temporal temperature of the wafer 4 supported on the support surface.

The ESC 40 includes at least one electrostatic clamping electrode, such as clamping electrode 8 and annular clamping electrode 8a, embedded inside the ESC ceramic layer 10 that are connected to an external power supply (not shown) to enable wafer clamping when an electrostatic clamping voltage is applied to the at least one clamping electrode. The electrostatic chuck assembly 40 also includes at least one declamping electrode, such as declamping electrode 18, embedded in the layer of ESC ceramic layer 10. The at least one declamping electrode is above the at least one electrostatic clamping electrode, wherein the at least one declamping electrode is operable to provide a path for draining any residual charge between the wafer 4 and the support surface of the ESC when the electrostatic clamping voltage is no longer applied to the at least one clamping electrode. For example, during wafer processing, the at least one declamping electrode is kept electrically floating such that it does not interfere with the at least one electrostatic clamping electrode. After the wafer has been processed, the control system 24 is configured to control a switch 41 such that conductive path 42 electrically connects the at least one declamping electrode 18 to ground or a voltage source, during declamping, such that any residual charge built up between the wafer 4 and the support surface may be drained. Again, the conductive path 42 can be connected to ground to drain any residual charge or alternatively the conductive path 42 can be connected to a voltage source wherein the voltage of the voltage source is selected such that any residual charge between the wafer and the support surface is drained such that the wafer 4 is declamped from the support surface of the ESC 40.

The at least one electrostatic clamping electrode 8 includes at least one pattern of an electrically conductive material and the at least one declamping electrode 18 includes at least one pattern of an electrically conductive material wherein the at least one pattern of the clamping electrode 8 and the at least one pattern of the declamping electrode 18 preferably overlap and have the same pattern. Preferably the at least one declamping electrode 18 included in the ESC assembly is about 10 microns or less beneath the upper surface of the support surface of the ESC assembly, and the at least one clamping electrode 8 is about 100 microns or more beneath the upper surface of the support surface of the ESC assembly.

For example, in an embodiment as illustrated in FIG. 2 the at least one clamping electrode includes a bipolar clamping electrode 8 and annular clamping electrode 8a which surrounds the clamping electrode 8. A declamping electrode 18 is above clamping electrode 8 wherein the declamping electrode 18 and clamping electrode 8 overlap and have the same pattern. Preferably during declamping, the declamping electrode 18 is connected to ground or a voltage source such that any residual charge between wafer 4 and the support surface of the ESC 40 can be drained. For example as illustrated in FIG. 2, the control system 24 can control switch 41 such that the declamping electrode 18 is electrically connected to ground by conductive path 42 during a declamping step.

Figure 3:
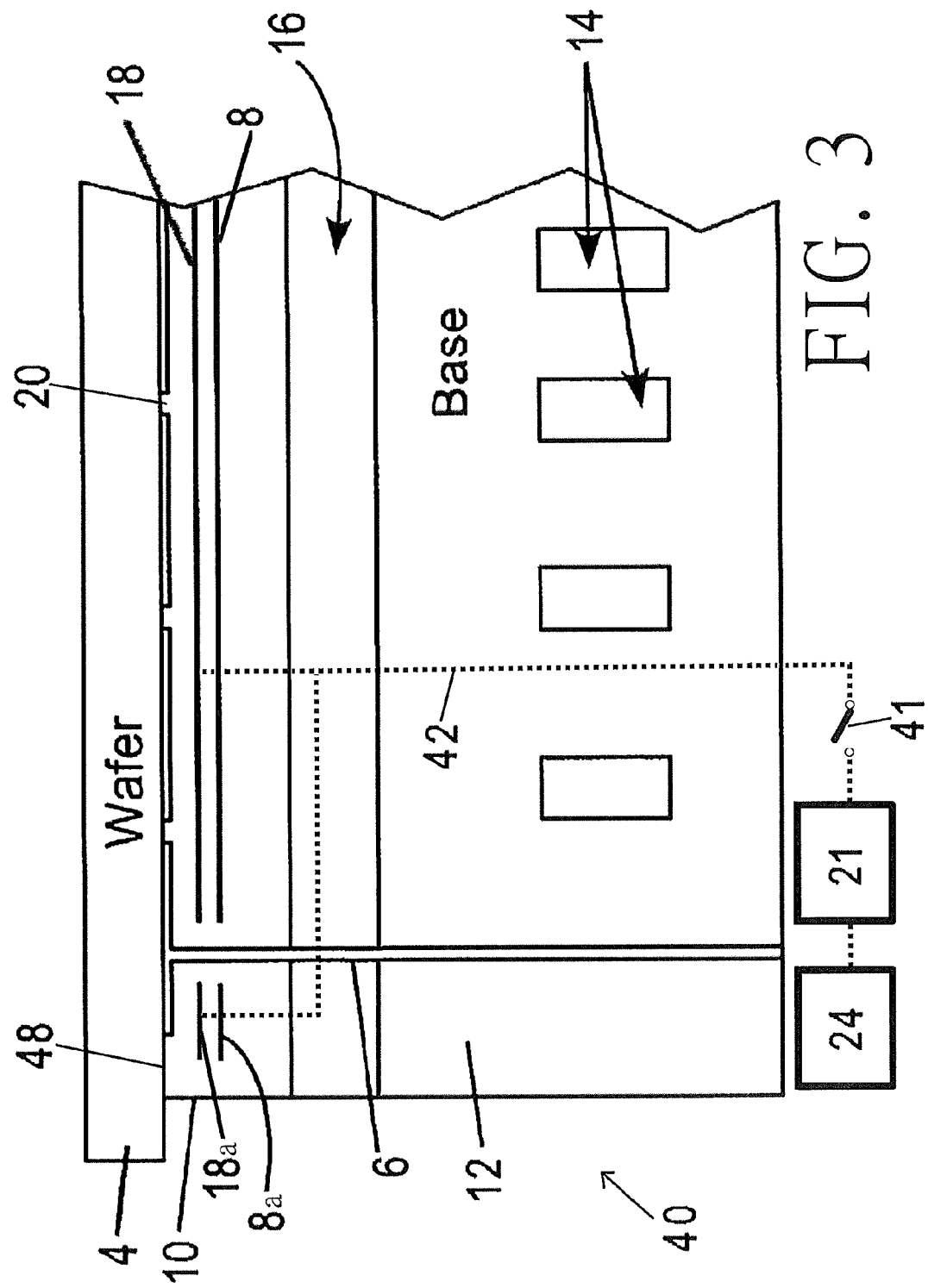
FIG. 3 is a schematic of an ESC assembly according to embodiments disclosed herein.

In an alternate embodiment, as illustrated by FIG. 3, the declamping electrode 18 can be surrounded by an annular declamping electrode 18a, wherein the annular declamping electrode 18a overlaps an annular clamping electrode 8a and the annular declamping electrode 18a and the annular clamping electrode 8a have the same pattern. Preferably during declamping, the declamping electrode 18 and the annular declamping electrode 18a are connected to ground or a voltage source such that any residual charge between wafer 4 and the support surface of the ESC 40 can be drained. For example as illustrated in FIG. 3, the control system 24 can control switch 41 and voltage source 21 such that the declamping electrode 18 and the annular declamping electrode 18a are electrically connected to the voltage source 21 by conductive path 42 during a declamping step wherein the voltage sources provides a voltage configured to drain any residual charge between the wafer 4 and the support surface of the ESC 40.

Figure 4:
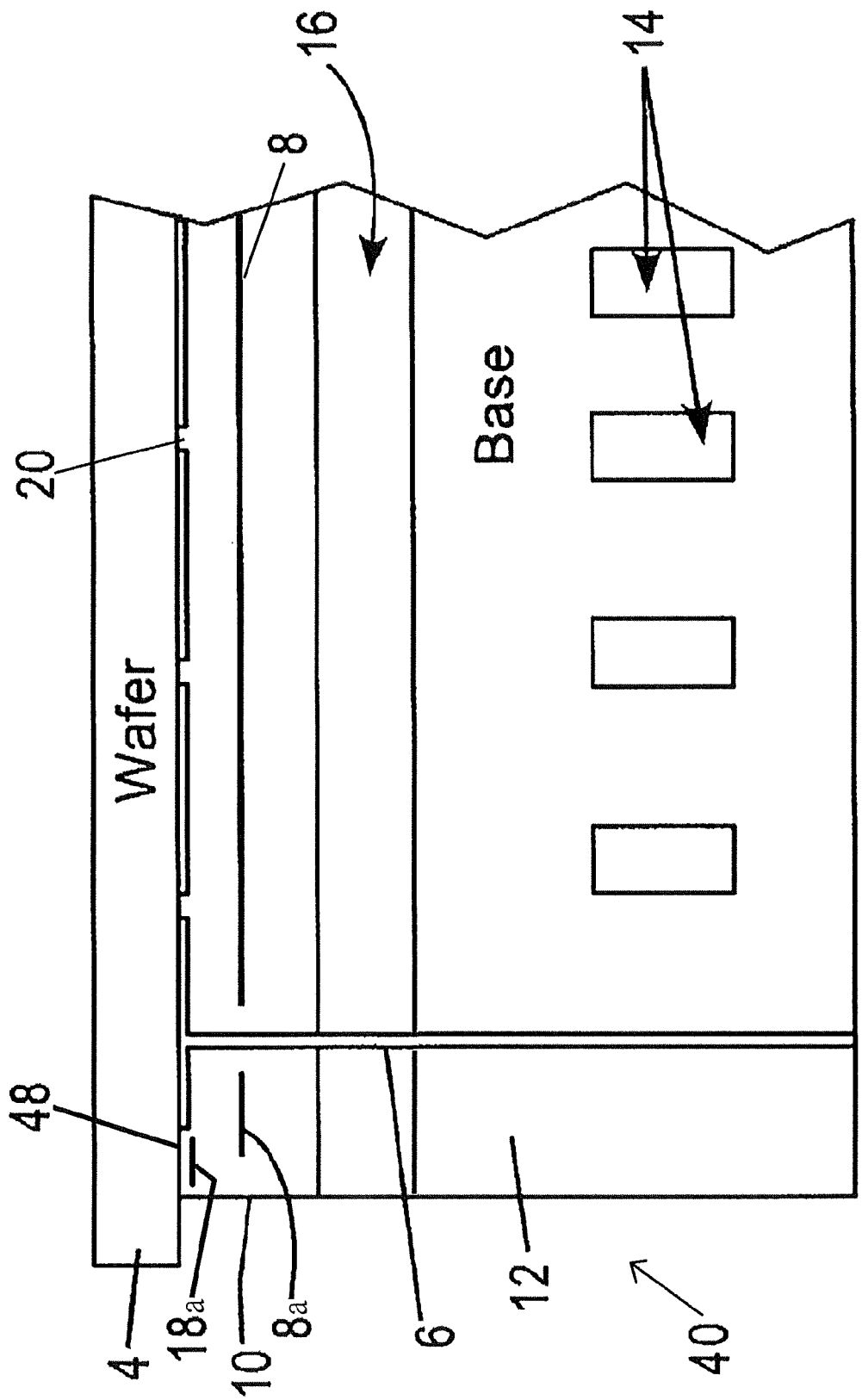
FIG. 4 is a schematic of an ESC assembly according to embodiments disclosed herein.
Figure 5:
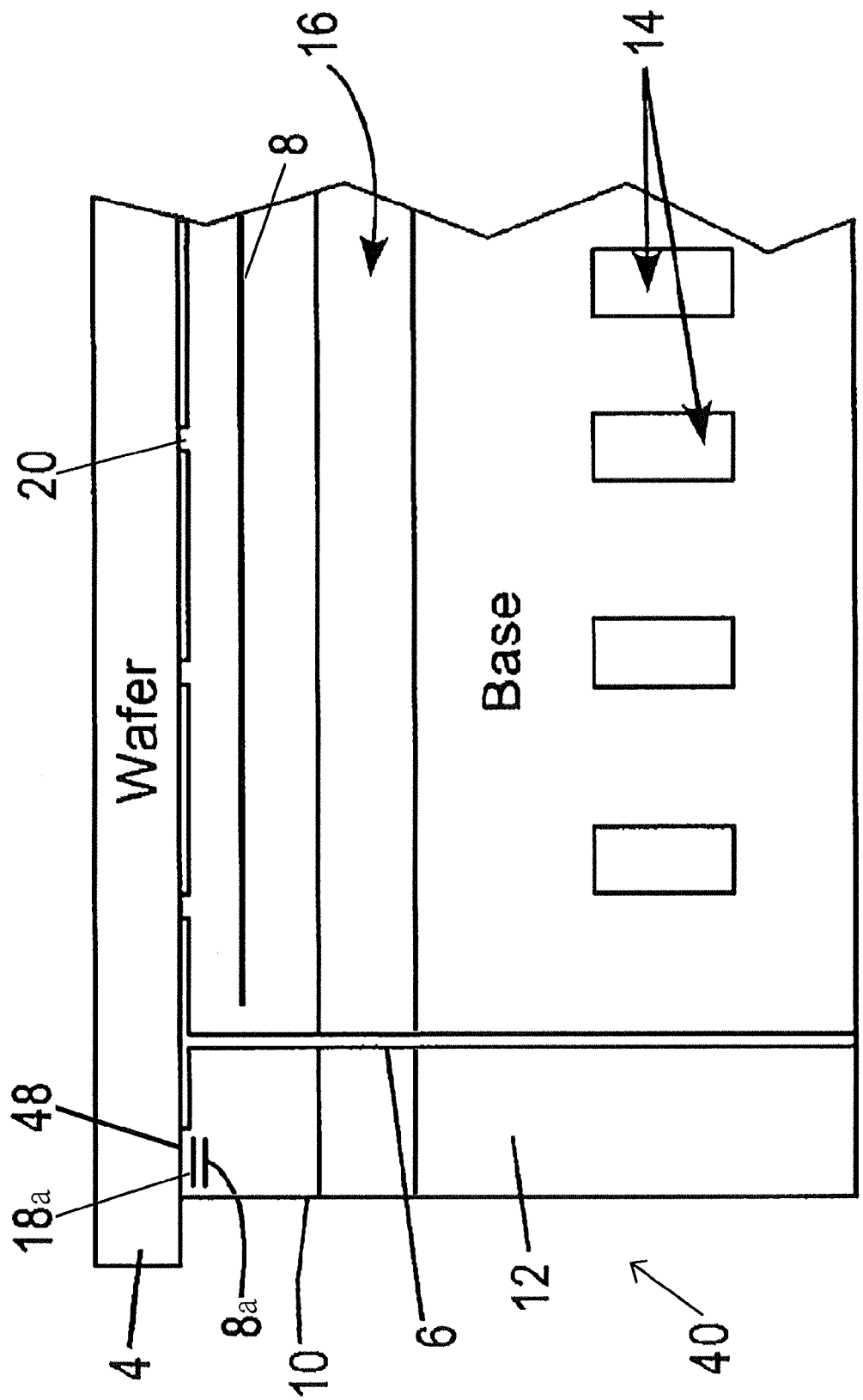
FIG. 5 is a schematic of an ESC assembly according to embodiments disclosed herein.
Figure 6:
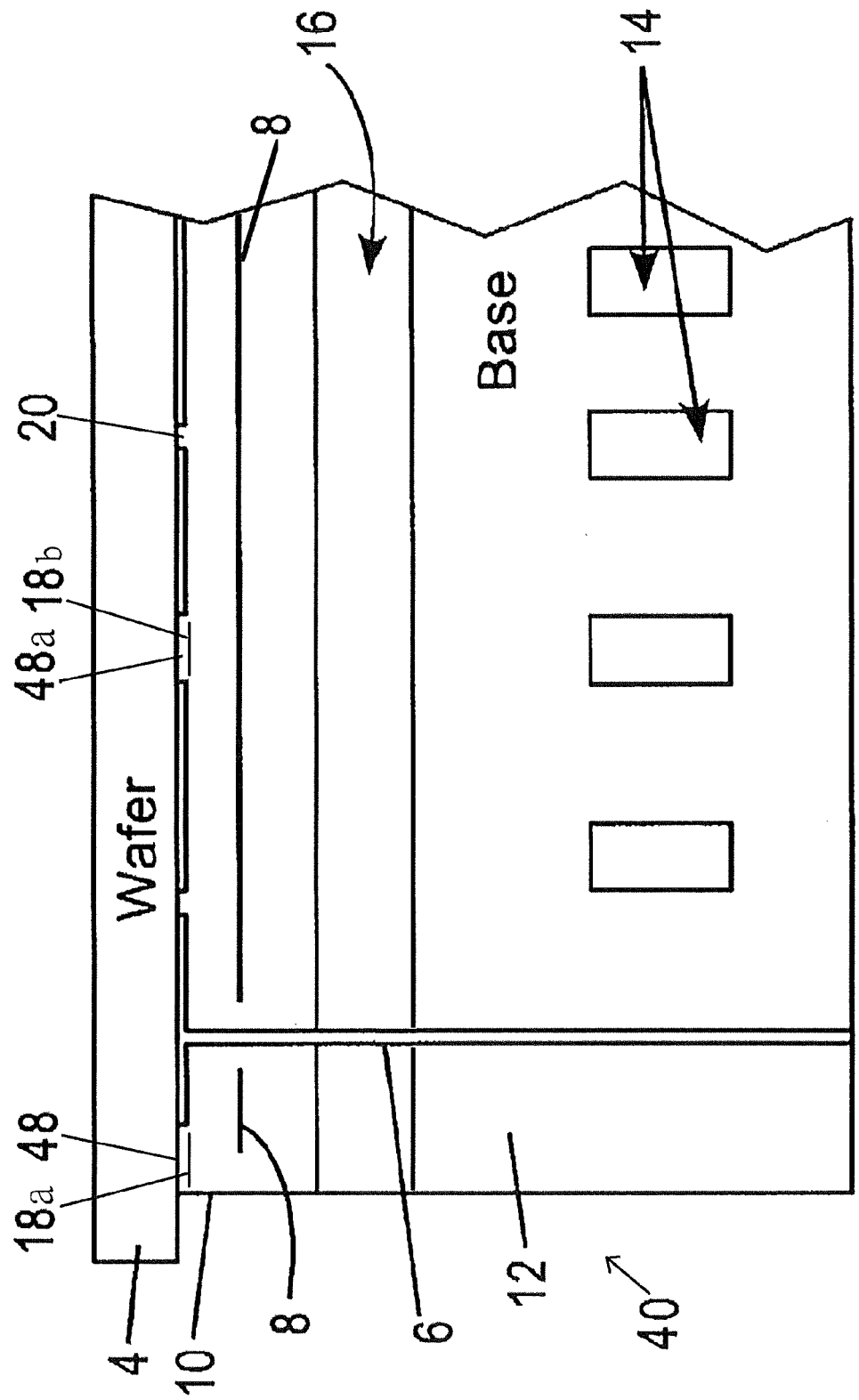
FIG. 6 is a schematic of an ESC assembly according to embodiments disclosed herein.

In an alternate embodiment, as illustrated in FIG. 4, the at least one electrostatic declamping electrode can be an annular declamping electrode 18a wherein the annular declamping electrode 18a is beneath the outer annular edge seal 48 of the support surface. The annular declamping electrode 18a of the at least one electrostatic declamping electrode is above the at least one electrostatic clamping electrode 8. Optionally, the at least one electrostatic declamping electrode can also include a declamping electrode 18 which is above electrostatic clamping electrode 8 as illustrated in FIGS. 2 and 3 wherein the electrostatic clamping electrode 8 and the declamping electrode 18 overlap and have the same pattern. In a further embodiment, as illustrated in FIG. 5, the annular clamping electrode 8a can be located beneath the outer annular edge seal 48 and the annular declamping electrode 18a. During processing, separate voltages can be applied to the annular clamping electrode 8a and the clamping electrode 8 such that a tight edge seal may be maintained between the outer annular edge seal 48 and the wafer 4. In an embodiment, as illustrated in FIG. 6, the ESC assembly 40 can also include an inner annular edge seal 48a wherein a first annular declamping electrode 18a can be included under the outer annular edge seal 48 and a second annular declamping electrode 18b can be included under the inner annular edge seal 48a wherein the inner annular edge seal 48a can separate regions of the support surface into zones wherein heat transfer gas (e.g. helium) is delivered to the backside of the wafer 4.

Figure 7:
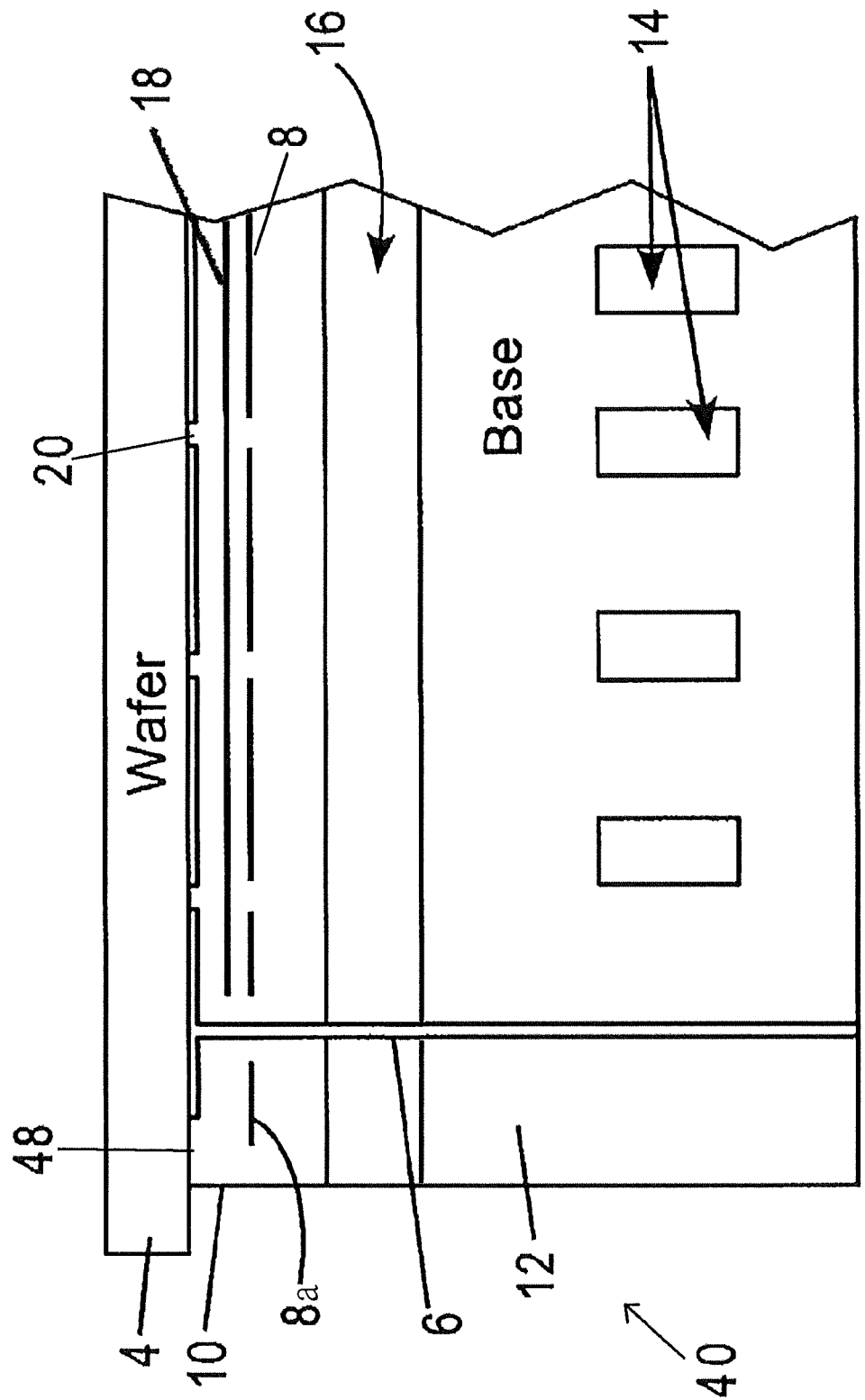
FIG. 7 is a schematic of an ESC assembly according to embodiments disclosed herein.
Figure 8:
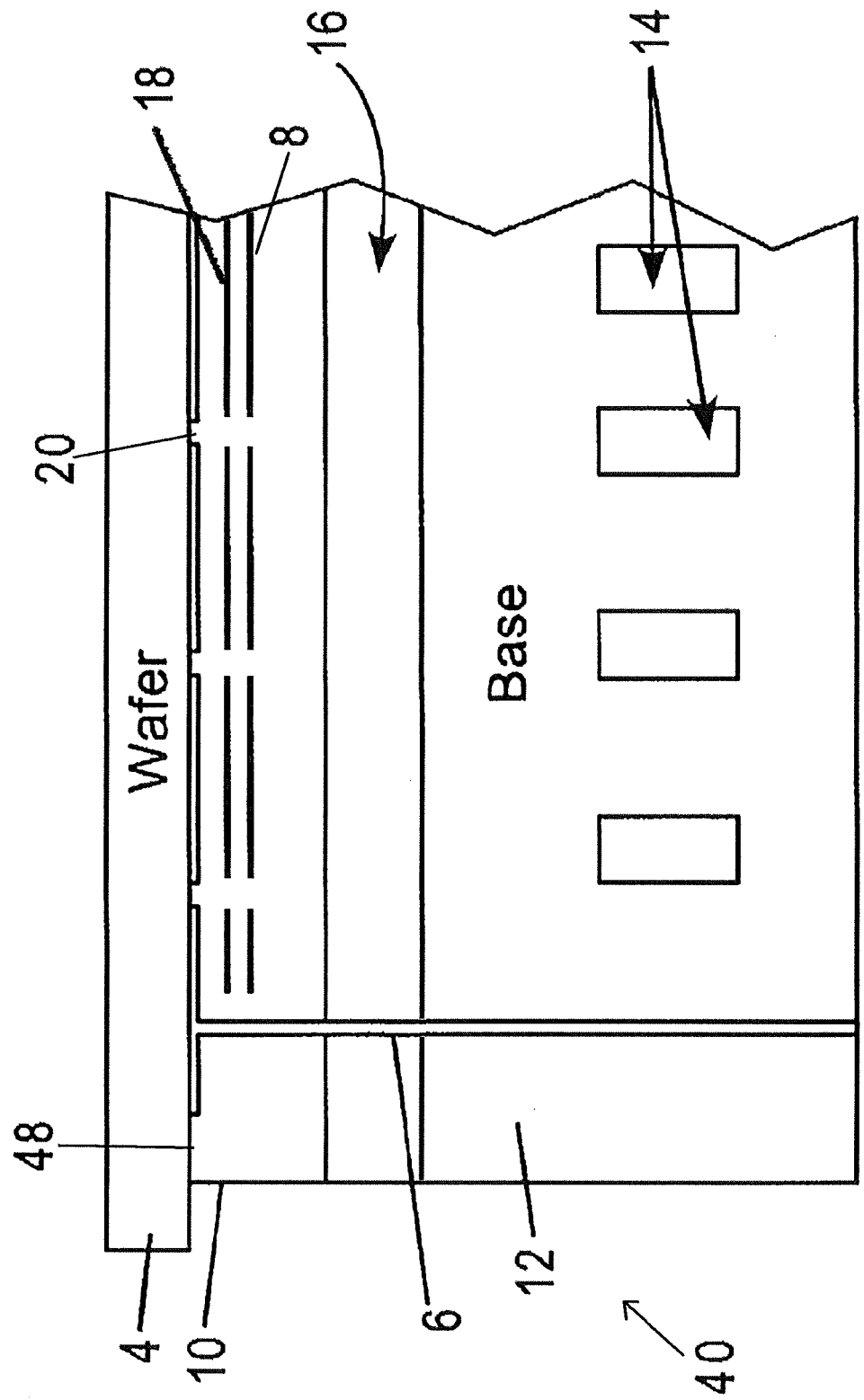
FIG. 8 is a schematic of an ESC assembly according to embodiments disclosed herein.

FIG. 7 illustrates a preferred embodiment of the ESC 40, wherein the clamping electrode 8 is patterned such that it is not directly below a mesa 20 of the plurality of mesas. In a further preferred embodiment, as illustrated in FIG. 8, the declamping electrode 18 can overlap with the clamping electrode 8 wherein the declamping electrode 18 and the clamping electrode 8 have the same pattern such that the declamping electrode 18 and the clamping electrode 8 are not directly below a mesa 20 of the plurality of mesas and further, the declamping electrode 18 and the clamping electrode 8 are not directly below any surface which supports the wafer 4. By arranging the pattern of the at least one clamping electrode and/or the at least one declamping electrode such that the at least one clamping electrode and/or the at least one declamping electrode are not directly below a mesa 20 of the plurality of mesas, and further not directly below any surface which supports the wafer 4, the amount of charge which becomes trapped between the wafer 4 and the support surface of the ESC is reduced.

During processing operations, such as plasma processing, process gas from a process gas source is supplied into a processing chamber (i.e. vacuum chamber) wherein the process gas is generated into plasma by supplying RF energy into the processing chamber such that the wafer may then be processed by a plasma etching or a plasma enhanced deposition process. While processing the semiconductor wafer in the vacuum chamber, a voltage is applied to the at least one electrostatic clamping electrode so as to clamp the semiconductor wafer to the support surface of the electrostatic chuck assembly while the at least one declamping electrode is kept electrically floating. After processing the wafer, the voltage to the electrostatic clamping electrode is turned off and the declamping electrode is electrically connected to a conductive path to provide a path for draining any residual charge between the semiconductor wafer and the support surface with the at least one declamping electrode thereby declamping the wafer from the support surface of the electrostatic chuck assembly. The conductive path can be connected to ground or a voltage source to thereby provide a path for draining residual charge between wafer and the support surface of the electrostatic chuck assembly. In an embodiment, the conductive path can be connected to a voltage source which has a polarity which is reverse to the voltage used to clamp the wafer on the support surface of the ESC thus facilitating the removal of residual charge between the wafer and the support surface. The wafer can then be raised from the support surface of the electrostatic chuck after the residual charge has been drained, or in an alternate embodiment, the wafer can be raised while any residual charge between the support surface and the wafer is drained.

While the invention has been described in detail with reference to specific embodiments thereof, it will be apparent to those skilled in the art that various changes and modifications can be made, and equivalents employed, without departing from the scope of the appended claims.

What is claimed is:

1. A semiconductor wafer processing apparatus for processing semiconductor wafers, comprising:
   a processing chamber in which a semiconductor wafer is processed;
   a process gas source in fluid communication with the processing chamber adapted to supply process gas into the processing chamber;
   a vacuum source adapted to exhaust process gas and byproducts of the processing from the processing chamber; and
   an electrostatic chuck assembly comprising a support surface in a layer of ceramic material on which the semiconductor wafer is supported during processing of the wafer in the chamber; at least one electrostatic clamping electrode embedded in the layer of ceramic material, the at least one electrostatic clamping electrode operable to apply an electrostatic clamping force to the wafer on the support surface when an electrostatic clamping voltage is applied to the clamping electrode; and at least one declamping electrode embedded in the layer of ceramic material above the at least one electrostatic clamping electrode operable to provide a path for draining any residual charge between the wafer and the support surface when the electrostatic clamping voltage is no longer applied to the clamping electrode.

2. The processing apparatus of claim 1, wherein the electrostatic chuck assembly further comprises a mesa pattern, comprising a plurality of mesas, on the support surface wherein the at least one electrostatic clamping electrode is patterned such that the at least one electrostatic clamping electrode is not directly below a mesa of the plurality of mesas and/or the at least one electrostatic declamping electrode is patterned such that the at least one electrostatic declamping electrode is not directly below a mesa of the plurality of mesas.

3. The processing apparatus of claim 1, wherein
   (a) the at least one electrostatic clamping electrode includes at least one pattern of an electrically conductive material, and the at least one declamping electrode includes at least one pattern of an electrically conductive material wherein the at least one pattern of the clamping electrode and the at least one pattern of the declamping electrode overlap and have the same pattern; and/or
   (b) the at least one electrostatic clamping electrode and the at least one declamping are not directly below any surface which supports the wafer.

4. The processing apparatus of claim 1, wherein the at least one electrostatic clamping electrode includes an annular clamping electrode beneath an outer annular edge seal of the support surface and the at least one electrostatic declamping electrode includes an annular declamping electrode beneath the outer annular edge seal of the support surface wherein the annular declamping electrode is above the annular clamping electrode.

5. The process apparatus of claim 1, wherein:
   (a) the at least one declamping electrode is about 10 microns or less beneath the upper surface of the support surface of the electrostatic chuck assembly; and/or
   (b) the at least one clamping electrode is about 100 microns or more beneath the upper surface of the support surface of the electrostatic chuck assembly.

6. The processing apparatus of claim 1, wherein:
   (a) the electrostatic chuck assembly further comprises at least one outlet in the support surface which delivers a heat transfer gas to an underside of the wafer, and at least one gas passage in the layer of ceramic material connected to a source of heat transfer gas operable to supply heat transfer gas at a desired pressure to the at least one gas passage;
   (b) a lower surface of the layer of ceramic material of the electrostatic chuck assembly is bonded to an upper surface of a heater plate, and a lower surface of the heater plate is bonded to an upper surface of a temperature controlled baseplate;
   (c) the electrostatic chuck assembly further comprises lift pins operable to lower the wafer onto the support surface of the electrostatic chuck assembly and to raise the wafer from the support surface of the electrostatic chuck assembly;
   (d) the processing apparatus further includes a RF energy source adapted to energize the process gas into a plasma state in the processing chamber; and/or
   (e) the electrostatic chuck assembly further includes a heater layer which includes independently controllable heater zones.

7. The processing apparatus of claim 1, wherein the electrostatic clamping electrode is a monopolar or bipolar electrostatic clamping electrode.

8. The processing apparatus of claim 1, further comprising a control system configured to control processes performed by the processing apparatus and a non-transitory computer machine-readable medium comprising program instructions for control of the processing apparatus.

9. The processing apparatus of claim 1, wherein the at least one declamping electrode is an annular declamping electrode beneath an outer annular edge seal of the support surface wherein the annular declamping electrode is above the clamping electrode and/or the at least one declamping electrode is an annular declamping electrode beneath an inner annular edge seal of the support surface wherein the annular declamping electrode is above the clamping electrode.

10. An electrostatic chuck assembly useful in a processing chamber of a wafer processing apparatus, comprising:
    a support surface in a layer of ceramic material on which a semiconductor wafer is supported during processing of the wafer in the chamber;
    at least one electrostatic clamping electrode embedded in the layer of ceramic material, the at least one electrostatic clamping electrode operable to apply an electrostatic clamping force to a wafer on the support surface when an electrostatic clamping voltage is applied to the clamping electrode; and
    at least one declamping electrode embedded in the layer of ceramic material above the at least one electrostatic clamping electrode operable to provide a path for draining any residual charge between the wafer and the support surface when the electrostatic clamping voltage is no longer applied to the clamping electrode.

11. The electrostatic chuck assembly of claim 10, further comprising a mesa pattern, comprising a plurality of mesas, on the support surface wherein the at least one electrostatic clamping electrode is patterned such that the at least one electrostatic clamping electrode is not directly below a mesa of the plurality of mesas and/or the at least one electrostatic declamping electrode is patterned such that the at least one electrostatic declamping electrode is not directly below a mesa of the plurality of mesas.

12. The electrostatic chuck assembly of claim 10, wherein
(a) the at least one electrostatic clamping electrode includes at least one pattern of an electrically conductive material, and the at least one declamping electrode includes at least one pattern of an electrically conductive material wherein the at least one pattern of the clamping electrode and the at least one pattern of the declamping electrode overlap and have the same pattern; and/or
(b) the at least one electrostatic clamping electrode and the at least one declamping are not directly below any surface which supports the wafer.

13. The electrostatic chuck assembly of claim 10, wherein the at least one electrostatic clamping electrode includes an annular clamping electrode beneath an outer annular edge seal of the support surface and the at least one electrostatic declamping electrode includes an annular declamping electrode beneath the outer annular edge seal of the support surface wherein the annular declamping electrode is above the annular clamping electrode.

14. The electrostatic chuck assembly of claim 10, wherein:
(a) the at least one declamping electrode is about 10 microns or less beneath the upper surface of the support surface of the electrostatic chuck assembly; and/or
(b) the at least one clamping electrode is about 100 microns or more beneath the upper surface of the support surface of the electrostatic chuck assembly.

15. The electrostatic chuck assembly of claim 10, wherein
(a) the electrostatic chuck assembly further comprises at least one outlet in the support surface which delivers a heat transfer gas to an underside of the wafer, and at least one gas passage in the layer of ceramic material connected to a source of heat transfer gas operable to supply heat transfer gas at a desired pressure to the at least one gas passage; and/or
(b) a lower surface of the layer of ceramic material is bonded to an upper surface of a heater plate, and a lower surface of the heater plate is bonded to an upper surface of a temperature controlled baseplate;
(c) the electrostatic chuck assembly further comprises lift pins operable to lower the wafer onto the support surface of the electrostatic chuck assembly and to raise the wafer from the support surface of the electrostatic chuck assembly; and/or
(d) the electrostatic chuck assembly further includes a heater layer which includes independently controllable heater zones.

16. The electrostatic chuck assembly of claim 10, wherein the electrostatic clamping electrode is a monopolar or bipolar electrostatic clamping electrode.

17. The electrostatic chuck assembly of claim 10, wherein the at least one declamping electrode is an annular declamping electrode beneath an outer annular edge seal of the support surface wherein the annular declamping electrode is above the clamping electrode and/or the at least one declamping electrode is an annular declamping electrode beneath an inner annular edge seal of the support surface wherein the annular declamping electrode is above the clamping electrode.

18. A method of declamping a semiconductor wafer from a support surface of an electrostatic chuck assembly after processing the semiconductor wafer in the apparatus according to claim 1, comprising:
supplying the process gas from the process gas source into the processing chamber; and
processing a semiconductor wafer in the processing chamber while applying a voltage to the at least one electrostatic clamping electrode so as to clamp the semiconductor wafer to the support surface of the electrostatic chuck assembly while electrically floating the at least one declamping electrode during the processing; and
shutting off the voltage to the electrostatic clamping electrode and electrically connecting the declamping electrode to a conductive path after processing the semiconductor wafer to provide a path for draining any residual charge between the wafer and the support surface with the at least one declamping electrode thereby declamping the wafer from the support surface of the electrostatic chuck assembly.

19. The method of claim 18, and
(a) grounding the conductive path or connecting the conductive path to a voltage source to drain any residual charge between the wafer and the support surface; and/or
(b) raising the wafer from the support surface of the electrostatic chuck while draining any residual charge between the wafer and the support surface.

20. The method of claim 18, wherein the processing comprises supplying RF energy into the plasma processing chamber thereby generating the process gas into plasma and plasma etching the wafer, or performing a deposition process.

* * * * *